United States Patent
Xu et al.

(10) Patent No.: US 12,347,950 B2
(45) Date of Patent: Jul. 1, 2025

(54) TERMINAL AND CENTRAL ELECTRICAL BOX

(71) Applicants: Tyco Electronics (Shanghai) Co., Ltd., Shanghai (CN); Tyco Electronics Technology (SIP) Ltd., Suzhou (CN)

(72) Inventors: Leilei Xu, Shanghai (CN); Xianghu Shen, Suzhou (CN); Debin Liang, Shanghai (CN); Jerry Zhu, Shanghai (CN)

(73) Assignees: Tyco Electronics (Shanghai) Co., Ltd., Shanghai (CN); Tyco Electronics Technology (SIP) Ltd., Suzhou (CN)

( * ) Notice: Subject to any disclaimer, the term of this patent is extended or adjusted under 35 U.S.C. 154(b) by 482 days.

(21) Appl. No.: 17/860,135

(22) Filed: Jul. 8, 2022

(65) Prior Publication Data
US 2023/0012762 A1    Jan. 19, 2023

(30) Foreign Application Priority Data
Jul. 16, 2021   (CN) .......................... 202121622509.1

(51) Int. Cl.
*H01R 12/58*     (2011.01)
*H01H 85/20*     (2006.01)
*H01R 4/02*      (2006.01)

(52) U.S. Cl.
CPC .......... *H01R 12/58* (2013.01); *H01H 85/205* (2013.01); *H01R 4/029* (2013.01)

(58) Field of Classification Search
CPC ...... H01R 12/58; H01R 4/029; H01R 12/718; H01R 12/7064; H01H 85/205; H01H 2085/2085; H05K 1/182; H05K 3/325; H05K 2201/10295
See application file for complete search history.

(56) References Cited

U.S. PATENT DOCUMENTS

| | | | | |
|---|---|---|---|---|
| 4,553,808 A * | 11/1985 | Weidler | ............... | H01R 13/113 439/830 |
| 5,624,269 A * | 4/1997 | Kanamori | .............. | H01R 12/58 439/876 |
| 6,511,336 B1 * | 1/2003 | Turek | ..................... | H02K 5/225 439/246 |
| 6,814,631 B2 * | 11/2004 | Baum | .................. | H01R 13/113 439/856 |
| 2006/0141825 A1 * | 6/2006 | Nakagawa | ............. | H05K 3/301 439/78 |
| 2022/0294133 A1 * | 9/2022 | Genau | ................ | H01R 12/7064 |

* cited by examiner

*Primary Examiner* — Edwin A. Leon
(74) *Attorney, Agent, or Firm* — Potomac Law Group, PLLC (57) ABSTRACT

A terminal used to be mounted on a circuit board. The terminal includes: a first termination part; a second termination part; and a bending part connected between the first termination part and the second termination part. The bending part is bent by a predetermined angle relative to the first termination part and the second termination part, so that the first termination part and the second termination part are staggered by a predetermined distance along a direction transverse to a direction of inserting the terminal to the circuit board. When the terminal is mounted on the circuit board, one of the first termination part and the second termination part passes through the circuit board, so that two electronic devices located on both sides of the circuit board can be directly electrically connected through the terminal.

14 Claims, 5 Drawing Sheets

TERMINAL AND CENTRAL ELECTRICAL BOX

CROSS-REFERENCE TO RELATED APPLICATION

This application claims the benefit of Chinese Patent Application No. 202121622509.1 filed on Jul. 16, 2021 in the State Intellectual Property Office of China, the whole disclosure of which is incorporated herein by reference.

BACKGROUND OF THE INVENTION

Field of the Invention

The present invention relates to a terminal and a central electrical box including the terminal.

Description of the Related Art

The central electrical box is an important component used in the automotive electrical system. Its function is to distribute power to the electrical equipment of the whole vehicle and protect the circuit. At the same time, it has a certain logic control function.

Generally, the central electrical box mainly includes a box body and a circuit board installed in the box body. In the prior art, a first terminal is provided on the front surface of the circuit board and is electrically connected with a pin of a fuse, a second terminal is provided on the back surface of the circuit board and is electrically connected with a cable connector, and the circuit board is also provided with a wiring electrically connected with the first terminal and the second terminal.

The existing technical scheme requires a large number of terminals and a high cost. In addition, the wiring connecting the first terminal and the second terminal needs to be printed on the circuit board. These wiring will occupy the area of the circuit board, resulting in increased current carrying load of the circuit board.

SUMMARY OF THE INVENTION

The present invention has been made to overcome or alleviate at least one aspect of the above mentioned disadvantages.

According to an aspect of the present invention, there is provided a terminal for being mounted on a circuit board. The terminal comprises: a first termination part; a second termination part; and a bending part connected between the first termination part and the second termination part. The bending part is bent by a predetermined angle relative to the first termination part and the second termination part, so that the first termination part and the second termination part are staggered by a predetermined distance along a direction transverse to a direction of inserting the terminal to the circuit board. When the terminal is mounted on the circuit board, one of the first termination part and the second termination part passes through the circuit board.

According to an exemplary embodiment of the present invention, the bending angle of the bending part relative to the first termination part and the second termination part is equal to 90 degrees; or the bending angle of the bending part relative to the first termination part and the second termination part is greater than 0 degrees and less than 90 degrees; or the bending angle of the bending part relative to the first termination part and the second termination part is greater than 90 degrees and less than 180 degrees.

According to another exemplary embodiment of the present invention, the bending angle of the bending part relative to the first termination part and the second termination part is equal to 90 degrees; when the terminal is mounted on the circuit board, the first termination part and the second termination part are perpendicular to the surface of the circuit board, and the bending part is parallel to the surface of the circuit board.

According to another exemplary embodiment of the present invention, when the terminal is mounted on the circuit board, the first termination part is located on one side of the circuit board to electrically connect with a first electronic device located on the one side of the circuit board; when the terminal is mounted on the circuit board, the second termination part passes through the circuit board to be electrically connected with a second electronic device located on the other side of the circuit board.

According to another exemplary embodiment of the present invention, when the terminal is mounted on the circuit board, the first termination part and the bending part are located on the same side of the circuit board.

According to another exemplary embodiment of the present invention, the termination further comprises a fixing part connected to the bending part and arranged on the side of the bending part for fixing the terminal to the circuit board; the fixing part is not parallel to the first termination part or the second termination part.

According to another exemplary embodiment of the present invention, the fixing part comprises: an insertion part adapted to be inserted into a first hole in the circuit board in an interference fit manner to fix the terminal to the circuit board; and a positioning part connected between the insertion part and the bending part and having a shoulder adapted to be supported and welded on the surface of the circuit board.

According to another exemplary embodiment of the present invention, when the terminal is mounted on the circuit board, the shoulder of the positioning part is supported on the surface of the circuit board, so that the bending part is spaced from the surface of the circuit board.

According to another exemplary embodiment of the present invention, the bending part is in a rectangular plate shape and has a pair of parallel first side edges and a pair of parallel second side edges; the first termination part and the second termination part are respectively connected to the pair of first side edges of the bending part; the fixing part is connected to the second side edge of the bending part.

According to another exemplary embodiment of the present invention, the first termination part and the second termination part are tongue shaped; the second termination part has a tongue part adapted to be plugged into a second electronic device; the thickness and/or width of the tongue part of the second termination part is different from that of the first termination part.

According to another exemplary embodiment of the present invention, the second termination part also has a base plate part, which is connected between the tongue part and the bending part; the thickness and/or width of the base plate part is different from that of the tongue part, and the base plate part is adapted to be inserted and positioned into a second hole in the circuit board.

According to another exemplary embodiment of the present invention, the thickness of other parts of the terminal except the tongue part is the same, and the thickness of the tongue part is different from the thickness of other parts of the terminal.

According to another aspect of the present invention, there is provided a central electrical box comprising: a box body; a circuit board installed in the box body; and the above terminal, which is mounted on the circuit board.

According to an exemplary embodiment of the present invention, the central electrical box further comprises a connection terminal and a safety device. The connection terminal is provided on the circuit board. The safety device includes: a housing with two slots; and a fuse received in the housing. The first termination part and the connection terminal are respectively inserted into the two slots of the safety device to be electrically connected with two pins of the fuse.

According to another exemplary embodiment of the present invention, the central electrical box further comprises a cable connector having an insertion slot. The second termination part of the terminal is inserted into the insertion slot of the cable connector to electrically connect with the cable connector.

In the foregoing exemplary embodiments according to the present invention, the terminal passes through the circuit board so that two electronic devices located on both sides of the circuit board can be directly electrically connected via the terminal. Therefore, the number of terminals is reduced, and there is no need to set wiring for electrically connecting the terminals on the circuit board, which greatly reduces the cost.

BRIEF DESCRIPTION OF THE DRAWINGS

The above and other features of the present invention will become more apparent by describing in detail exemplary embodiments thereof with reference to the accompanying drawings, in which.

DETAILED DESCRIPTION OF PREFERRED EMBODIMENTS

Exemplary embodiments of the present disclosure will be described hereinafter in detail with reference to the attached drawings, wherein the like reference numerals refer to the like elements. The present disclosure may, however, be embodied in many different forms and should not be construed as being limited to the embodiment set forth herein; rather, these embodiments are provided so that the present disclosure will be thorough and complete, and will fully convey the concept of the disclosure to those skilled in the art.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

According to a general technical concept of the present invention, there is provided a terminal for being mounted on a circuit board. The terminal comprises: a first termination part; a second termination part; and a bending part connected between the first termination part and the second termination part. The bending part is bent by a predetermined angle with respect to the first termination part and the second termination part, so that the first termination part and the second termination part are staggered by a predetermined distance along a direction transverse to a direction of inserting the terminal to the circuit board. When the terminal is mounted on the circuit board, one of the first termination part and the second termination part passes through the circuit board.

Figure 1:
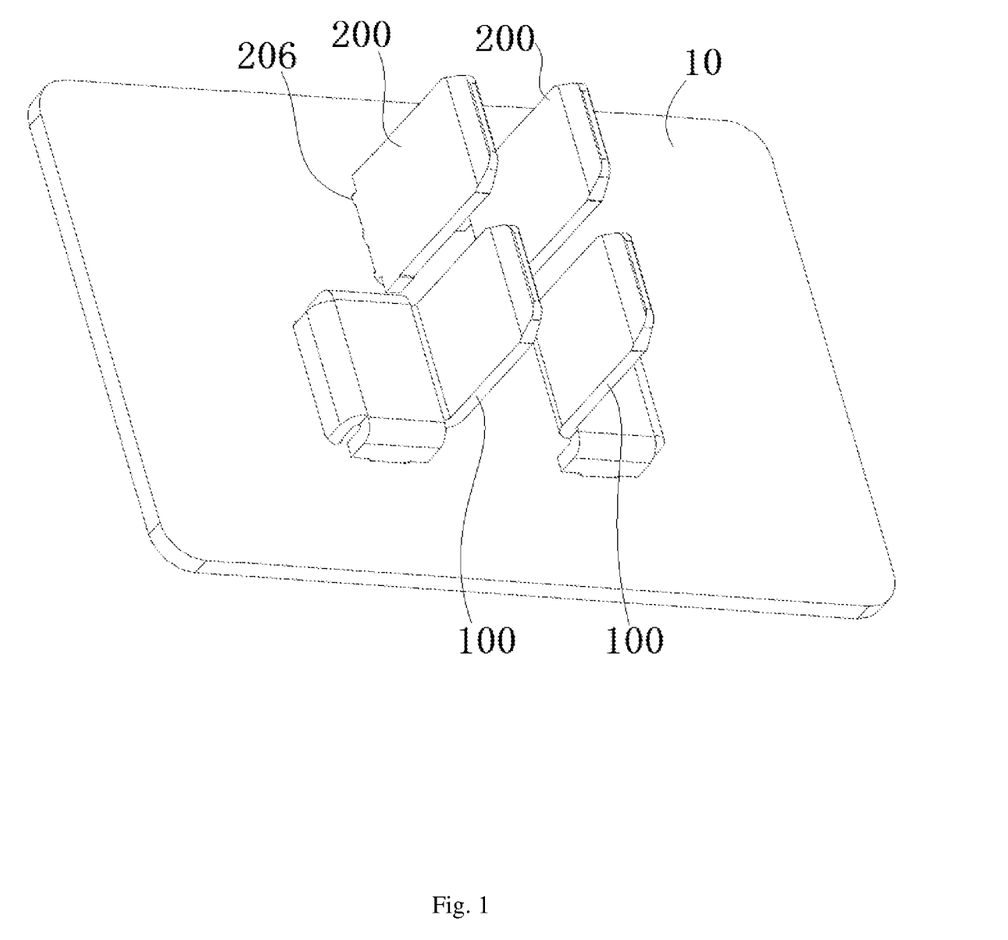
FIG. 1 is an illustrative perspective view of a circuit board, a terminal mounted on the circuit board and a connection terminal according to an exemplary embodiment of the present invention.
Figure 2:
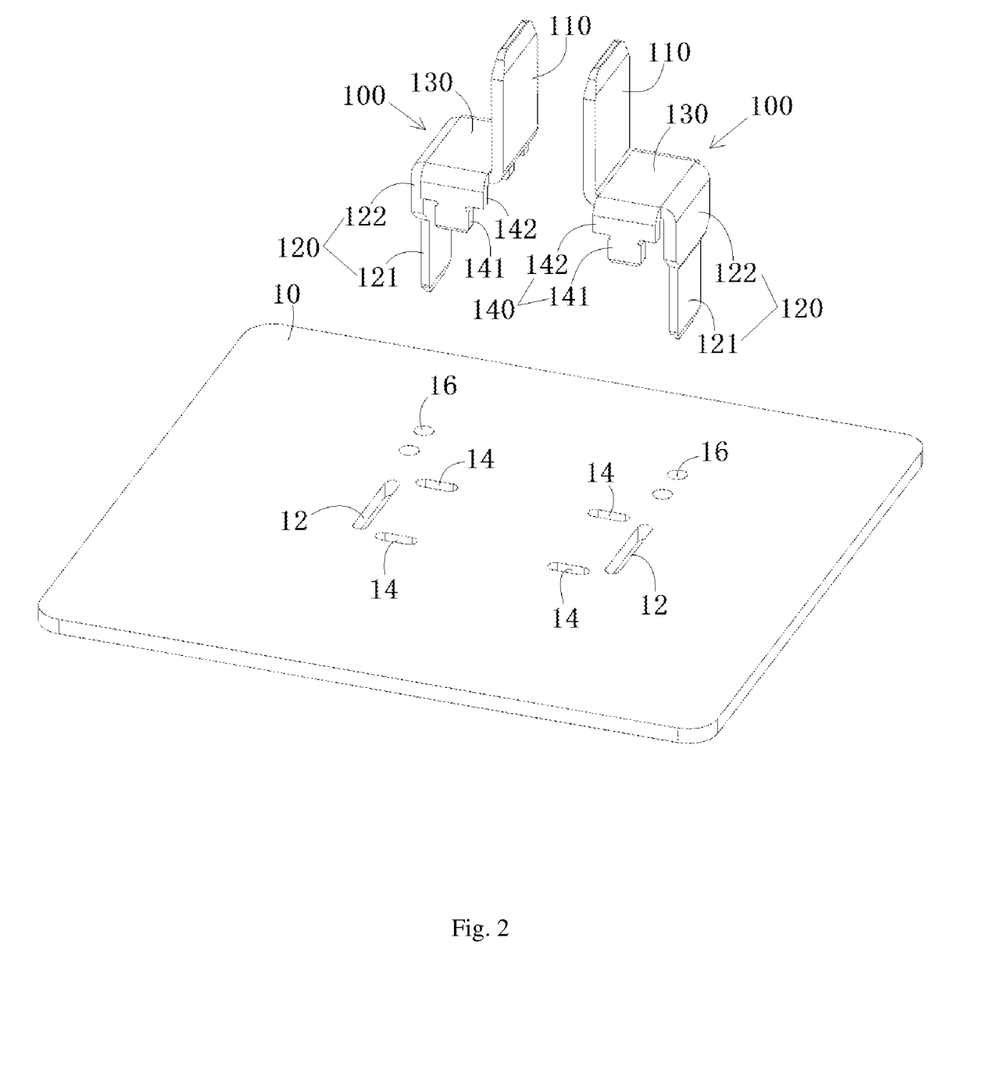
FIG. 2 shows an illustrative perspective view of the circuit board and terminals shown in FIG. 1, in which the terminals have not been mounted on the circuit board.

FIG. 1 is an illustrative perspective view of a circuit board 10, a terminal 100 and a connection terminal 200 mounted on the circuit board 10 according to an exemplary embodiment of the present invention. FIG. 2 is an illustrative perspective view of the circuit board 10 and the terminals 100 shown in FIG. 1, wherein the terminals 100 have not been mounted on the circuit board 10.

As shown in FIGS. 1 and 2, in the illustrated embodiment, the terminal 100 is used to be mounted on the circuit board 10. The terminal 100 mainly includes a first termination part 110, a second termination part 120 and a bending part 130. The bending part 130 is connected between the first termination part 110 and the second termination part 120.

As shown in FIG. 1 and FIG. 2, in the illustrated embodiment, the bending part 130 is bent by a predetermined angle relative to the first termination part 110 and the second termination part 120 so that the first termination part 110 and the second termination part 120 are staggered by a predetermined distance in a direction transverse to a direction of inserting the terminal 100 to the circuit board 10, that is, the first termination part 110 and the second termination part 120 are staggered by a predetermined distance in a direction parallel to the surface of the circuit board 10. In the present invention, the staggered distance between the first termination part 110 and the second termination part 120 can be adjusted by adjusting the length of the bending part 130.

As shown in FIGS. 1 and 2, in the illustrated embodiment, when the terminal 100 is mounted on the circuit board 10, one of the first termination part 110 and the second termination part 120 passes through the circuit board 10, so that two electronic devices located on both sides of the circuit board 10 can be directly electrically connected via the terminal. Therefore, the present invention can reduce the number of terminals, and does not need to set wiring for electrically connecting these terminals on the circuit board, which facilitates the layout of electronic devices and greatly reduces the cost. In the illustrated embodiment, since different electronic devices are arranged on both sides of the circuit board 10, the positions of the termination parts 110 and 120 are different, which is more conducive to the layout of electronic devices.

Figure 3:
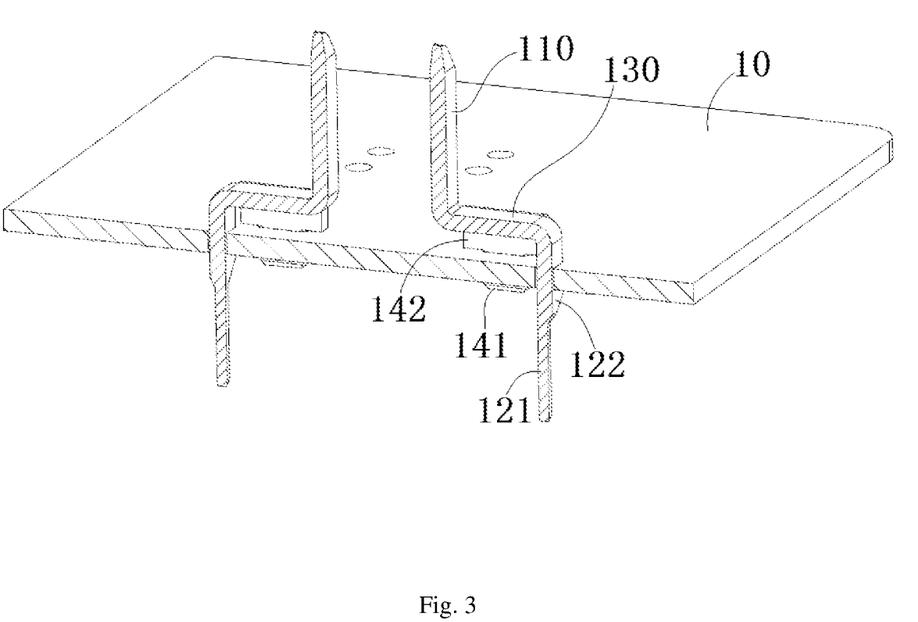
FIG. 3 shows a sectional view of the circuit board and terminals shown in FIG. 1.
Figure 4:
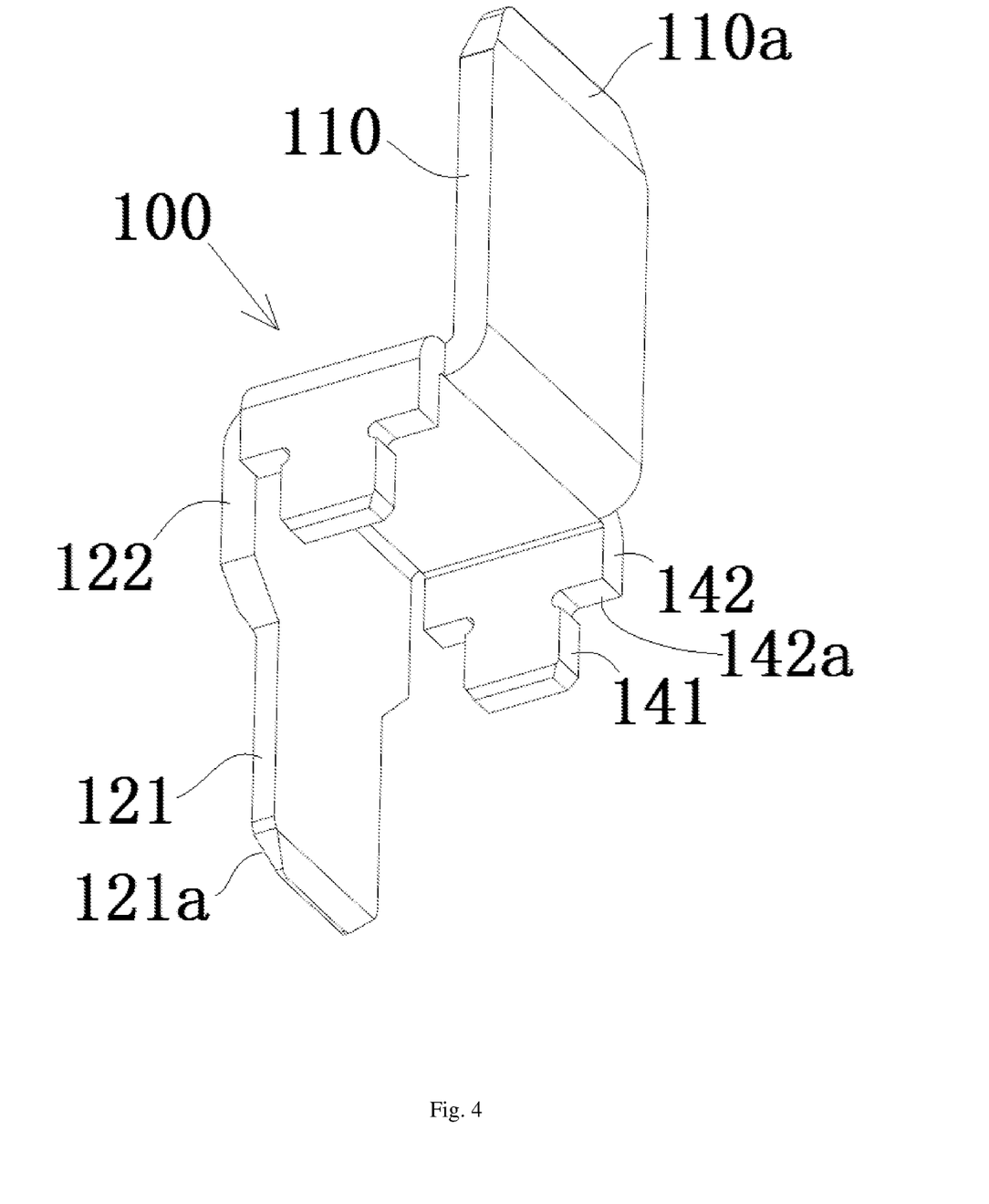
FIG. 4 is an illustrative perspective view of one terminal shown in FIG. 1 when viewed from the bottom side.
Figure 5:
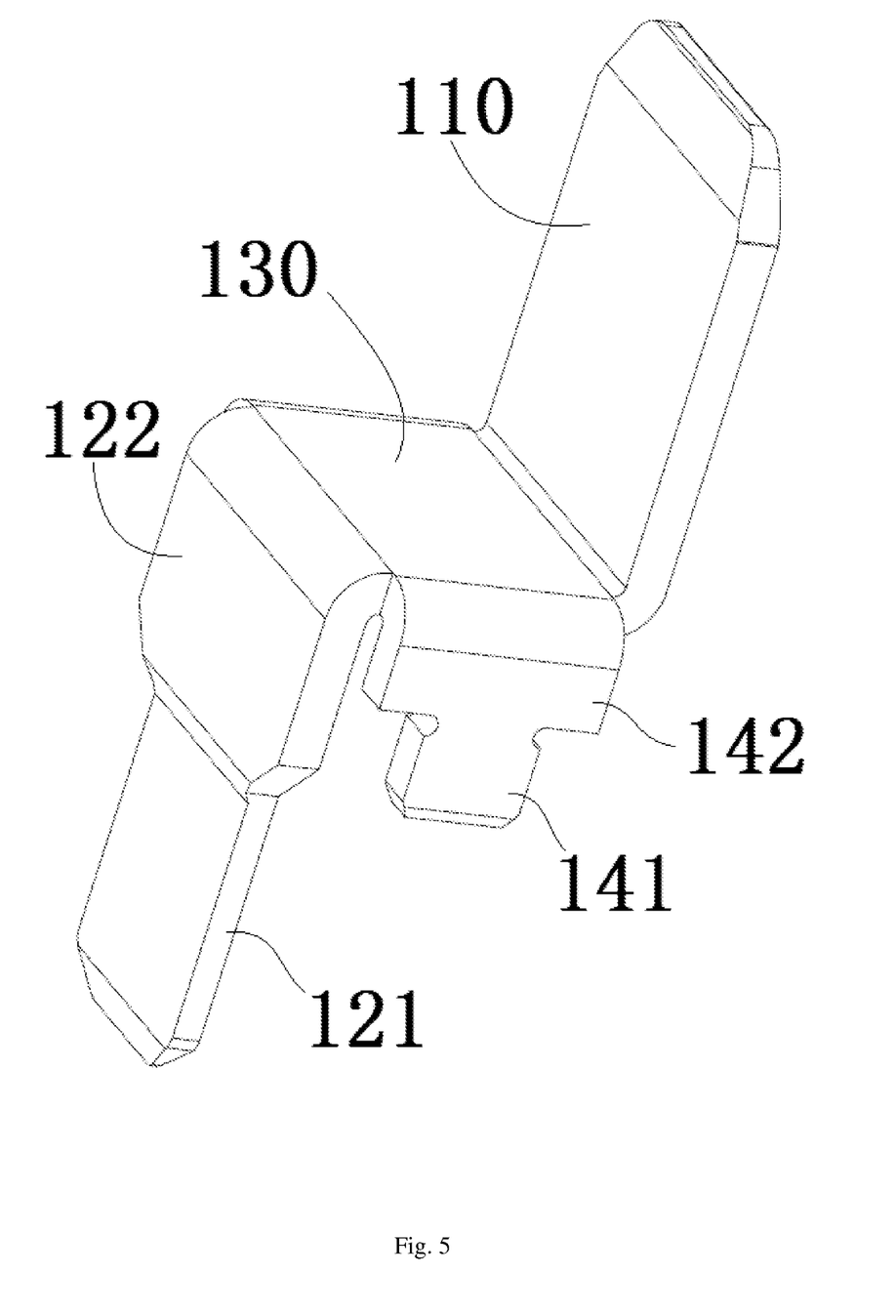
FIG. 5 is an illustrative perspective view of one terminal shown in FIG. 1 when viewed from the top side.

FIG. 3 shows a sectional view of the circuit board 10 and the terminals 100 shown in FIG. 1; FIG. 4 is an illustrative perspective view of one terminal 100 shown in FIG. 1 when viewed from the bottom side; FIG. 5 is an illustrative perspective view of one terminal 100 shown in FIG. 1 when viewed from the top side.

As shown in FIGS. 1 to 5, in the illustrated embodiment, the bending angle of the bending part 130 of the terminal 100 with respect to the first termination part 110 and the second termination part 120 is equal to 90 degrees. Therefore, in the illustrated embodiment, when the terminal 100 is mounted on the circuit board 10, the first termination part 110 and the second termination part 120 are perpendicular to the surface of the circuit board 10, and the bending part 130 is parallel to the surface of the circuit board 10.

However, please note that the present invention is not limited to the illustrated embodiment. For example, in an optional embodiment of the present invention, the bending angle of the bending part 130 relative to the first termination part 110 and the second termination part 120 may be greater than 0 degrees and less than 90 degrees. In another optional embodiment of the present invention, the bending angle of the bending part 130 with respect to the first termination part 110 and the second termination part 120 may be greater than 90 degrees and less than 180 degrees.

As shown in FIGS. 1 to 5, in the illustrated embodiment, when the terminal 100 is mounted on the circuit board 10, the first termination part 110 is located on one side (E. G., the front side) of the circuit board 10 to electrically connect with a first electronic device (E. G., a fuse) located on one side of the circuit board 10.

As shown in FIGS. 1 to 5, in the illustrated embodiment, when the terminal 100 is mounted on the circuit board 10, the second termination part 120 passes through the circuit board 10 to electrically connect with a second electronic device (E. G., a cable connector) located on the other side (E. G., the back side) of the circuit board 10.

As shown in FIGS. 1 to 5, in the illustrated embodiment, when the terminal 100 is mounted on the circuit board 10, the first termination part 110 and the bending part 130 are located on the same side of the circuit board 10. In the illustrated embodiment, both the first termination part 110 and the bending part 130 are located on the front side of the circuit board 10.

As shown in FIGS. 1 to 5, in the illustrated embodiment, the terminal 100 also includes a pair of fixing parts 140. A pair of fixing parts 140 are connected to the bending part 130 and symmetrically distributed on both sides of the bending part 130 for fixing the terminal 100 to the circuit board 10.

As shown in FIGS. 1 to 5, in the illustrated embodiment, the fixing part 140 includes an insertion part 141 and a positioning part 142. The insertion parts 141 of the pair of fixing parts 140 are respectively inserted into a pair of first holes 14 in the circuit board 10 in interference fit manner to fix the terminal 100 to the circuit board 10. Therefore, the terminal 100 can be prevented from being separated from the circuit board 10. However, the present invention is not limited to this, and the insertion part 141 may also be formed into an elastic latch suitable for mating with the first hole 14.

As shown in FIGS. 1 to 5, in the illustrated embodiment, the positioning part 142 is connected between the insertion part 141 and the bending part 130. The positioning part 142 has a shoulder 142a adapted to be supported on the surface of the circuit board 10, and the shoulder 142a of the positioning part 142 can be welded on the surface of the circuit board 10. In this way, the mechanical connection strength between the terminal 100 and the circuit board 10 can be enhanced, and the separation of the terminal 100 and the circuit board 10 can be further prevented. In an exemplary embodiment of the present invention, the fixing part 140 is not arranged in parallel with the first termination part 110 or the second termination part 120, so as to have a larger welding space. For example, in the illustrated embodiment, the fixing part 140 is arranged to be perpendicular to the first end connection portion 110, the second end connection portion 120, and the bending part 130.

As shown in FIGS. 1 to 5, in the illustrated embodiment, when the terminal 100 is mounted on the circuit board 10, the shoulder 142a of the positioning part 142 is supported on the surface of the circuit board 10 so that the bending part 130 is spaced from the surface of the circuit board 10 by a predetermined gap. That is, when the terminal is mounted on the circuit board 10, the bending part 130 is not in contact with the surface of the circuit board 10.

As shown in FIGS. 1 to 5, in the illustrated embodiment, the bending part 130 is in a rectangular plate shape with a pair of parallel first side edges and a pair of parallel second side edges. The first termination part 110 and the second termination part 120 are respectively connected to the pair of first side edges of the bending part 130. The pair of fixing parts 140 are respectively connected to the pair of second side edges of the bending part 130.

As shown in FIGS. 1 to 5, in the illustrated embodiment, the first termination part 110 and the second termination part 120 are tongue shaped. The second termination part 120 has a tongue part 121 adapted to be inserted into the second electronic device. The thickness and/or width of the tongue part 121 of the second termination part 120 is different from that of the first termination part 110. For example, in the illustrated embodiment, the thickness and width of the tongue 121 of the second termination part 120 are smaller than those of the second termination part 120. In this way, the application range of the terminal 100 can be expanded.

As shown in FIGS. 1 to 5, in the illustrated embodiment, the second termination part 120 also has a base plate part 122 connected between the tongue part 121 and the bending part 130. In the illustrated embodiment, the thickness and/or width of the base plate part 122 are different from those of the tongue part 121. For example, in the illustrated embodiment, the thickness and width of the base plate part 122 are greater than those of the tongue part 121. The base plate part 122 is adapted to be inserted and positioned into a second hole 12 in the circuit board 10.

As shown in FIGS. 1 to 5, in the illustrated embodiment, the thickness of other parts of the terminal 100 except the tongue part 121 is the same, and the thickness of the tongue 121 is different from that of other parts of the terminal 100. In the illustrated embodiment, the thickness and width of the base plate part 122 of the second termination part 120 are the same as those of the first termination part 110.

In an exemplary embodiment of the present invention, a central electrical box is also disclosed, which comprises a box body (not shown), a circuit board 10 and the aforementioned terminal 100. The circuit board 10 is installed in the box body. The terminal 100 is mounted on the circuit board 10.

In an exemplary embodiment of the present invention, the central electrical box also includes a safety device (not shown) and a connection terminal 200. The connection terminal 200 is provided on the circuit board 10. In the illustrated embodiment, the pin 206 of the connection terminal 200 is inserted into the hole 16 in the circuit board 10. The aforementioned safety device mainly includes a housing (not shown) and a fuse (not shown) contained in the housing. Two slots are formed on the housing. The first termination part 110 and the connection terminal 200 are respectively inserted into two slots of the safety device to be electrically connected with two pins of the fuse.

In an exemplary embodiment of the present invention, the central electrical box also includes a cable connector (not shown). The tongue part 121 of the second termination part 120 of the terminal 100 is inserted into an insertion slot of the cable connector to electrically connect with the cable connector.

In the illustrated embodiment, the safety device and the cable connector are located on the front side and the back side of the circuit board 10, respectively. The first termination part 110 of the terminal 100 is located on the front side of the circuit board 10 to be electrically connected with the safety device. The second termination part 120 of the terminal 100 passes through the circuit board 10 to electrically connect with the cable connector located on the back side of the circuit board 10.

As shown in FIG. 4, in the illustrated embodiment, an inclined guide part 110a is formed on the end of the first termination part 110 to guide the first termination part 110 to be smoothly inserted into the slot of the safety device. Similarly, an inclined guide portion 121a is formed on the end of the tongue part 121 of the second termination part 120 to guide the tongue part 121 of the second termination part 120 to be smoothly inserted into the insertion slot of the cable connector.

It should be appreciated for those skilled in this art that the above embodiments are intended to be illustrated, and not restrictive. For example, many modifications may be made to the above embodiments by those skilled in this art, and various features described in different embodiments may be freely combined with each other without conflicting in configuration or principle.

Although several exemplary embodiments have been shown and described, it would be appreciated by those skilled in the art that various changes or modifications may be made in these embodiments without departing from the principles and spirit of the disclosure, the scope of which is defined in the claims and their equivalents.

As used herein, an element recited in the singular and proceeded with the word "a" or "an" should be understood as not excluding plural of said elements or steps, unless such exclusion is explicitly stated. Furthermore, references to "one embodiment" of the present invention are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

The invention claimed is:

1. A terminal for being mounted on a circuit board, the terminal comprises:
   a first termination part;
   a second termination part; and
   a bending part connected between the first termination part and the second termination part;
   a fixing part connected to the bending part for fixing the terminal to the circuit board;
   wherein the bending part is bent by a predetermined angle relative to the first termination part and the second termination part, so that the first termination part and the second termination part are staggered by a predetermined distance along a direction transverse to a direction of inserting the terminal to the circuit board;
   wherein when the terminal is mounted on the circuit board, one of the first termination part and the second termination part passes through the circuit board;
   wherein when the terminal is mounted on the circuit board, the first termination part is located on one side of the circuit board to electrically connect with a first electronic device located on the one side of the circuit board; and
   wherein when the terminal is mounted on the circuit board, the second termination part passes through the circuit board to be electrically connected with a second electronic device located on the other side of the circuit board.

2. The terminal according to claim 1,
   wherein the bending angle of the bending part relative to the first termination part and the second termination part is equal to 90 degrees; or
   wherein the bending angle of the bending part relative to the first termination part and the second termination part is greater than 0 degrees and less than 90 degrees; or
   wherein the bending angle of the bending part relative to the first termination part and the second termination part is greater than 90 degrees and less than 180 degrees.

3. The terminal according to claim 1,
   wherein the bending angle of the bending part relative to the first termination part and the second termination part is equal to 90 degrees;
   wherein when the terminal is mounted on the circuit board, the first termination part and the second termination part are perpendicular to the surface of the circuit board, and the bending part is parallel to the surface of the circuit board.

4. The terminal according to claim 1,
   wherein when the terminal is mounted on the circuit board, the first termination part and the bending part are located on the same side of the circuit board.

5. The terminal according to claim 1,
   wherein the fixing part is arranged on the side of the bending part;
   wherein the fixing part is not parallel to the first termination part or the second termination part.

6. The terminal according to claim 1,
   wherein the fixing part comprises:
      an insertion part adapted to be inserted into a first hole in the circuit board in an interference fit manner to fix the terminal to the circuit board; and
      a positioning part connected between the insertion part and the bending part and having a shoulder adapted to be supported and welded on the surface of the circuit board.

7. The terminal according to claim 6,
   wherein when the terminal is mounted on the circuit board, the shoulder of the positioning part is supported on the surface of the circuit board, so that the bending part is spaced from the surface of the circuit board.

8. The terminal according to claim 1,
   wherein the bending part is in a rectangular plate shape and has a pair of parallel first side edges and a pair of parallel second side edges;
   wherein the first termination part and the second termination part are respectively connected to the pair of first side edges of the bending part;
   wherein the fixing part is connected to the second side edge of the bending part.

9. The terminal according to claim 1,
   wherein the first termination part and the second termination part are tongue shaped;
   wherein the second termination part has a tongue part adapted to be plugged into a second electronic device;

wherein the thickness and/or width of the tongue part of the second termination part is different from that of the first termination part.

10. The terminal according to claim 9,
wherein the second termination part also has a base plate part, which is connected between the tongue part and the bending part;
wherein the thickness and/or width of the base plate part is different from that of the tongue part, and the base plate part is adapted to be inserted and positioned into a second hole in the circuit board.

11. The terminal according to claim 10, wherein the thickness of other parts of the terminal except the tongue part is the same, and the thickness of the tongue part is different from the thickness of other parts of the terminal.

12. A central electrical box, comprising:
a box body;
a circuit board installed in the box body; and
the terminal according to claim 1, which is mounted on the circuit board.

13. The central electrical box according to claim 12, further comprising:
a connection terminal provided on the circuit board; and
a safety device, including:
a housing with two slots; and
a fuse received in the housing,
wherein the first termination part and the connection terminal are respectively inserted into the two slots of the safety device to be electrically connected with two pins of the fuse.

14. The central electrical box according to claim 12, further comprising:
a cable connector having an insertion slot,
wherein the second termination part of the terminal is inserted into the insertion slot of the cable connector to electrically connect with the cable connector.

* * * * *